United States Patent
Cho et al.

(10) Patent No.: US 11,872,515 B2
(45) Date of Patent: *Jan. 16, 2024

(54) APPARATUS FOR TRAPPING OF REACTION BY-PRODUCT CAPABLE OF EXPANDING THE AREA FOR COLLECTION BY INDUCING GAS FLOW

(71) Applicant: MILAEBO CO., LTD., Pyeongtaek-si (KR)

(72) Inventors: Che Hoo Cho, Seoul (KR); Yeon Ju Lee, Osan-si (KR); In Hwan Kim, Osan-si (KR); Jun Min Lee, Osan-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/832,268

(22) Filed: Jun. 3, 2022

(65) Prior Publication Data

US 2023/0277972 A1 Sep. 7, 2023

(30) Foreign Application Priority Data

Mar. 4, 2022 (KR) .................. 10-2022-0027785

(51) Int. Cl.
*B01D 46/12* (2022.01)
*B01D 50/20* (2022.01)
(Continued)

(52) U.S. Cl.
CPC ............. *B01D 50/20* (2022.01); *B01D 45/08* (2013.01); *B01D 45/16* (2013.01); *B01D 46/12* (2013.01); *C23C 16/4412* (2013.01)

(58) Field of Classification Search
CPC ........ B01D 50/20; B01D 45/08; B01D 45/16; B01D 46/12; C23C 16/4412
See application file for complete search history.

(56) References Cited

U.S. PATENT DOCUMENTS 5,820,641 A * 10/1998 Gu ..................... B01D 5/0006
55/DIG. 15
6,156,107 A * 12/2000 Hayashi ................ B01D 45/08
438/905

(Continued)

FOREIGN PATENT DOCUMENTS

KR  10-0717837 B1   5/2007
KR  10-0862684 B1  10/2008
(Continued)

*Primary Examiner* — Dung H Bui
(74) *Attorney, Agent, or Firm* — YOU & IP, LLC; Wansik You

(57) ABSTRACT

The present disclosure relates to an apparatus for trapping of a reaction by-product capable of expanding the area for collection by inducing a gas flow, in which an internal trapping tower of the apparatus for trapping of a reaction by-product, which traps a reaction by-product contained in gas discharged from a process chamber during a semiconductor manufacturing process, is divided into multiple stages, the introduced gas is guided to a lower side of an inner region of an intermediate trapping unit provided as a space portion and discharged to an outer region while a trapping reaction occurs according to the reaction by-product trapping amount during a former part of a use duration time.

13 Claims, 13 Drawing Sheets

(51) Int. Cl.
  *C23C 16/44* (2006.01)
  *B01D 45/16* (2006.01)
  *B01D 45/08* (2006.01)

(56) References Cited

U.S. PATENT DOCUMENTS

| | | | | |
|---|---|---|---|---|
| 6,238,514 | B1 * | 5/2001 | Gu | H01J 37/32844 |
| | | | | 118/715 |
| 11,054,174 | B2 * | 7/2021 | Hwang | F24H 3/00 |
| 11,173,439 | B2 * | 11/2021 | Cho | H01L 21/67017 |
| 11,623,175 | B1 * | 4/2023 | Cho | H01J 37/32844 |
| | | | | 423/210 |
| 2007/0107595 | A1 * | 5/2007 | Na | B01D 53/68 |
| | | | | 95/288 |
| 2009/0107091 | A1 * | 4/2009 | Cho | C23C 16/4412 |
| | | | | 55/440 |
| 2009/0217634 | A1 * | 9/2009 | Choi | H01L 21/67017 |
| | | | | 55/428.1 |
| 2010/0166630 | A1 * | 7/2010 | Gu | B01F 25/4521 |
| | | | | 422/171 |
| 2011/0252969 | A1 * | 10/2011 | Fischer | C23C 16/4412 |
| | | | | 55/434.2 |
| 2019/0194804 | A1 * | 6/2019 | Cho | H01L 21/67098 |
| 2020/0164296 | A1 * | 5/2020 | Cho | H01L 21/67017 |
| 2020/0217559 | A1 * | 7/2020 | Hwang | F24H 3/00 |
| 2020/0321226 | A1 * | 10/2020 | Cho | C23C 16/4412 |
| 2021/0039034 | A1 * | 2/2021 | Cho | B01D 45/08 |
| 2021/0053002 | A1 * | 2/2021 | Cho | B01D 45/06 |
| 2021/0134621 | A1 * | 5/2021 | Cho | C23C 16/4412 |
| 2021/0134701 | A1 * | 5/2021 | Cho | H01L 23/473 |
| 2022/0143543 | A1 * | 5/2022 | Maeng | B01D 50/20 |
| 2022/0228261 | A1 * | 7/2022 | Cho | C23C 16/4412 |
| 2022/0349052 | A1 * | 11/2022 | Cho | C23C 16/4401 |
| 2022/0349053 | A1 * | 11/2022 | Cho | H01J 37/32651 |
| 2022/0410047 | A1 * | 12/2022 | Cho | H01L 21/67069 |

FOREIGN PATENT DOCUMENTS

| | | |
|---|---|---|
| KR | 10-1447629 B1 | 10/2014 |
| KR | 10-1806480 B1 | 1/2018 |
| KR | 10-2228180 B1 | 3/2021 |
| KR | 102311939 B1 * | 10/2021 |

* cited by examiner

APPARATUS FOR TRAPPING OF REACTION BY-PRODUCT CAPABLE OF EXPANDING THE AREA FOR COLLECTION BY INDUCING GAS FLOW

CROSS-REFERENCE TO RELATED APPLICATIONS

This application claims the priority of Korean Patent Application No. 10-2022-0027785 filed on Mar. 4, 2022, in the Korean Intellectual Property Office, the disclosure of which is incorporated herein by reference.

BACKGROUND

Field

The present disclosure relates to an apparatus for trapping of a reaction by-product capable of expanding the area for collection by inducing a gas flow, and more particularly, to an apparatus for trapping of a reaction by-product, that traps a reaction by-product by allowing gas, which is discharged from a process chamber during a semiconductor manufacturing process, to flow to an inner region of an internal trapping tower in the apparatus for trapping of a reaction by-product during a former part of a use duration time, and expands an available trapping region, so that an additional trapping reaction occurs, by allowing gas to flow to an outer region of the internal trapping tower during a latter part of the use duration time for which the trapping amount is increased and the available trapping region is decreased, thereby improving trapping efficiency.

Description of the Related Art

In general, a semiconductor manufacturing process is broadly divided into a front-end process (fabrication process) and a back-end process (assembly process). The front-end process refers to a process of manufacturing semiconductor chips by processing specific patterns by repeatedly performing a procedure of depositing thin films on wafers in various types of process chambers and a procedure of selectively etching the deposited thin films. The back-end process refers to a process of individually separating the chips manufactured in the front-end process and then assembling finished products by combining the chips and lead frames.

In this case, the process of depositing the thin film on the wafer or etching the thin film deposited on the wafer is performed at a high temperature by injecting necessary process gases such as a precursor gas for depositing the thin film and injecting etching gases into a process chamber through a gas injection system. In this case, various types of reaction by-products, which are not used for deposition, unreacted ignitable gases, and harmful gases containing corrosive foreign substances and toxic substance are produced in large amount in the process chamber, and the resultant products are discharged as exhaust gases.

Therefore, in a semiconductor manufacturing facility, an apparatus for trapping of a reaction by-product is installed to trap a reaction by-product contained in exhaust gas discharged from the process chamber. The apparatus for trapping of a reaction by-product traps the reaction by-product contained in the exhaust gas, and then a scrubber positioned in an exhaust line finally purifies non-reacted gas and then discharges the gas into the atmosphere.

Meanwhile, when the apparatus for trapping of a reaction by-product traps the reaction by-product in an internal trapping tower for a use duration time, the reaction by-products are mainly attached or accumulated between a housing and an outer side of a trapping plate of the internal trapping tower, which causes rapid deterioration in trapping efficiency.

When the reaction by-product trapping efficiency of the apparatus for trapping of a reaction by-product deteriorates as described above, the apparatus for trapping of a reaction by-product is replaced with a new apparatus for trapping of a reaction by-product or an apparatus for trapping of a reaction by-product regenerated by cleaning the interior of the internal trapping tower and the interior of the housing of the apparatus for trapping of a reaction by-product to smoothly perform the semiconductor manufacturing process.

There is a region in which additional trapping is enabled in the internal trapping tower even though the trapping efficiency of the apparatus for trapping of a reaction by-product deteriorates as described above. However, the available trapping region cannot be sufficiently utilized, and the apparatus for trapping of a reaction by-product is replaced. For this reason, there is a problem in that the use duration time may be shortened, and the semiconductor manufacturing cost may be inevitably increased.

Accordingly, there is a need for a technology capable of sufficiently utilizing the available trapping region in the apparatus for trapping of a reaction by-product and increasing the use duration time of the apparatus for trapping of a reaction by-product, but this technology has not been proposed up to now.

DOCUMENTS OF RELATED ART

Patent Documents (Patent Document 1) Korean Patent No. 10-0717837 (registered on May 7, 2007)
(Patent Document 2) Korean Patent No. 10-0862684 (registered on Oct. 2, 2008)
(Patent Document 3) Korean Patent No. 10-1447629 (registered on Sep. 29, 2014)
(Patent Document 4) Korean Patent No. 10-1806480 (registered on Dec. 1, 2017)

SUMMARY

An object to be achieved by the present disclosure is to provide an apparatus for trapping of a reaction by-product, in which an internal trapping tower of the apparatus for trapping of a reaction by-product, which traps a reaction by-product contained in gas discharged from a process chamber during a semiconductor manufacturing process, is divided into multiple stages, the introduced gas is guided to a lower side of an inner region of an intermediate trapping unit provided as a space portion and discharged to an outer region while a trapping reaction occurs according to the reaction by-product trapping amount during a former part of a use duration time, and the gas flows to the outer region from an upper side of the inner region of the intermediate trapping unit and is guided downward so that an additional trapping reaction occurs during a latter part of the use duration time for which the trapping amount is increased and an available trapping region is decreased, thereby enabling additional reaction by-product trapping by expanding the available trapping region.

Another object to be achieved by the present disclosure is to provide an apparatus for trapping of a reaction by-product, in which a plurality of planar cross-shaped vertical plates is arranged in a quadrangular shape at predetermined intervals in a circumferential direction of an intermediate trapping unit constituting an internal trapping tower having multiple stages, a planar inner cross-shaped vertical plate is provided at a lower center of an inner region so that trapping occurs, and each of the planar cross-shaped vertical plates defining a periphery is formed so that an upper side thereof has a large inner region area and a lower side thereof has a large outer region area, such that a trapping reaction occurs by expanding an available trapping region having a trapping space in which a lower space of the inner region is larger than an upper space of the inner region.

Still another object to be achieved by the present disclosure is to provide an apparatus for trapping of a reaction by-product, in which introduced gas quickly flows downward without a load while being guided along a planar shape of a planar cross-shaped vertical plate, the reaction by-product is accumulated in an inner region space after a trapping reaction occurs on an inner surface of the planar cross-shaped vertical plate and a planar inner cross-shaped vertical plate during a former part of a use duration time, and the gas flows to an outer region from an upper side of an inner region of the planar cross-shaped vertical plate and then flows downward along an outer surface so that an additional trapping reaction occurs during a latter part of the use duration time, such that a trapping reaction occurs by expanding an available trapping region.

Yet another object to be achieved by the present disclosure is to provide an apparatus for trapping of a reaction by-product, in which gas discharged outward from an intermediate trapping unit of an internal trapping tower having multiple stages flows to a lower end trapping unit, vortex plates are installed in multiple stages vertically along an outer lower periphery of the intermediate trapping unit and used, such that a vortex is generated by reducing a flow velocity of gas flowing downward after being discharged to the outside of the intermediate trapping unit, thereby performing a trapping reaction while increasing a trapping reaction time and preventing the trapped and accumulated reaction by-product from leaking downward.

An aspect of the present disclosure provides an apparatus for trapping of a reaction by-product capable of expanding the area for collection by inducing a gas flow, which accommodates gas, which is discharged after a deposition process during a semiconductor manufacturing process, in a housing, heats the gas with a heater, traps a reaction by-product contained in the gas by using an internal trapping tower, and discharges only the gas, in which the internal trapping tower is configured to trap, in multiple stages, the reaction by-product according to height, the internal trapping tower including: an upper end trapping unit configured to perform a trapping reaction while guiding a main flow of the gas to a central portion; an intermediate trapping unit having a structure having an inner region is formed as a space portion so as to accommodate the introduced gas and trap the reaction by-product; and a lower end trapping unit configured to prevent a leak of the trapped reaction by-product to a gas discharge port of the housing while trapping, in multiple stages, the reaction by-product from the gas introduced through a lateral side, the upper end trapping unit, the intermediate trapping unit, and the lower end trapping unit being separated provided, and in which the intermediate trapping unit is configured such that depending on a change in trapping amount according to an elapse of a use duration time, a main flow of the gas is guided so that the gas flows toward an outer region after flowing downward to an inner region of planar cross-shaped vertical plates defining a periphery during a former part of the use duration time, and the gas is guided to flow downward after flowing to the outer region of the planar cross-shaped vertical plates from an upper side of the inner region during a latter part of the use duration time when the trapped reaction by-product is accumulated in the inner region, such that an additional trapping reaction is performed.

In the exemplary embodiment, the upper end trapping unit may guide the gas, which is distributed in a direction from the heater toward an outer periphery in the housing and flows downward, to the intermediate trapping unit through a main gas hole formed in a central portion and relatively small auxiliary gas holes circularly arranged around the main gas hole, the intermediate trapping unit being disposed below the upper end trapping unit and spaced apart from the upper end trapping unit at a predetermined interval, and the upper end trapping unit may trap the reaction by-product contained in the gas on an upper surface installed with triangular plates and cross-shaped plates and a lower surface installed with quadrangular plates.

In the exemplary embodiment, the triangular plates may be radially arranged on an upper surface of the upper end trapping unit and protrude so that an inclination thereof increases from an outer periphery toward the main gas hole while traversing the plurality of auxiliary gas holes circularly arranged in multiple rows, the cross-shaped plates may be disposed between the triangular plates and vertically protrude while traversing the auxiliary gas holes, the cross-shaped plates may be radially arranged to guide the gas flow and generate vortices so as to improve trapping efficiency, and the quadrangular plates may be radially arranged on a lower surface of the upper end trapping unit and vertically protrude while traversing the auxiliary gas holes so as to perform the trapping while guiding the uniform downward flow of the exhaust gas moving downward through the main gas hole and the auxiliary gas holes.

In the exemplary embodiment, the intermediate trapping unit may include a plurality of planar cross-shaped vertical plates coupled to a lower portion spaced apart from the upper end trapping unit at a predetermined interval, the plurality of planar cross-shaped vertical plates being disposed to be spaced apart from one another to have gaps at predetermined intervals and defining a periphery, and a planar inner cross-shaped vertical plate may be provided at a lower center of an inner region of the cross-shaped vertical plates that defines the periphery.

In the exemplary embodiment, an exhaust plate may be provided below the planar cross-shaped vertical plates and the inner cross-shaped vertical plate and have a plurality of gas holes through which the gas introduced into a lower side in the inner region is discharged to the outer region.

In the exemplary embodiment, the planar cross-shaped vertical plate may be formed such that an area in which the planar cross-shaped vertical plate protrudes toward the inner region is large at the upper side, and an area in which the planar cross-shaped vertical plate protrudes toward the outer region is large at the lower side, such that a trapping space is formed such that a lower space in the inner region is larger than an upper space in the inner region.

In the exemplary embodiment, the apparatus for trapping of a reaction by-product may include vortex plates disposed below the outer region of the planar cross-shaped vertical plates, installed along a periphery of the outer region of the planar cross-shaped vertical plates, and having a plurality of gas holes.

In the exemplary embodiment, the vortex plates may be installed in multiple stages vertically, the vortex plate at a lower stage may be larger, and the vortex plate may be inclined so that an outer side thereof is high.

In the exemplary embodiment, the lower end trapping unit may be connected to the lower portion of the intermediate trapping unit and include an outer periphery trapping plate part, an intermediate trapping plate part, and an inner trapping plate part which have a plurality of gas holes formed in surfaces thereof and are disposed in multiple stages, the lower end trapping unit may prevent the gas, which has experienced the trapping reaction in the inner region and the outer region of the intermediate trapping unit, from flowing downward directly into the gas discharge port provided on a lower plate of the housing, the gas may be guided toward the inner side from the outer periphery, such that the trapping reaction is finally performed, and the flow of the gas may be guided so that the gas flows into the upper side of the gas discharge port protruding upward from the central portion of the lower plate of the housing and then flows downward.

In the exemplary embodiment, the outer peripheral trapping plate part may have a structure opened at a lower side thereof and include an upper trapping plate and lateral trapping plates each having a plurality of gas holes, and a plurality of vortex generating pieces may be installed along the outer surface of the outer periphery trapping plate part and vertically arranged in multiple stages, and the plurality of vortex generating pieces may be inclined upward at an inclination angle toward the outside.

In the exemplary embodiment, the intermediate trapping plate part may have a structure opened at a lower side thereof and spaced apart from an upper surface of the outer peripheral trapping plate part at a predetermined interval by spacers, and the intermediate trapping plate part may include an upper trapping plate having a closed structure, and lateral trapping plates having a plurality of gas holes.

In the exemplary embodiment, the inner trapping plate part may have a structure opened at upper and lower sides thereof and is fixed to the intermediate trapping plate part, and the inner trapping plate part may include lateral trapping plates having a plurality of gas holes.

In the exemplary embodiment, the housing may include a plurality of filtering plates arranged at predetermined intervals, and the plurality of filtering plates may protrude in an oblique direction along a periphery of a gas discharge port protruding upward from a lower plate and generate a vortex of the gas flowing upward.

According to the apparatus for trapping of a reaction by-product capable of expanding the area for collection by inducing a gas flow according to the present disclosure having the above-mentioned features, the internal trapping tower installed in the apparatus for trapping of a reaction by-product is divided into the upper end trapping unit, the intermediate trapping unit, and the lower end trapping unit. The gas, which is introduced into the apparatus for trapping of a reaction by-product after being discharged from the process chamber after the deposition process during the semiconductor manufacturing process, flows to the lower region of the central portion in the intermediate trapping unit having the inner region as the space portion and is discharged to the outside during the former part of the use duration time, such that the unreacted reaction by-product contained in the gas is trapped in the inner region of the cross-shaped vertical plate and accumulated in the space of the inner region. Thereafter, during the latter part of the use duration time when the trapping reaction time is increased and the trapped reaction by-product is accumulated in the inner region such that the available trapping region is reduced, the flow of the gas is guided such that the introduced gas flows outward from the upper side of the intermediate trapping unit and then flows downward along the outer region of the planar cross-shaped vertical plate, such that the additional trapping is performed. Therefore, it is possible to additionally trap the reaction by-product by expanding the available trapping region and improve the trapping efficiency of the apparatus for trapping of a reaction by-product.

In addition, according to the present disclosure, the intermediate trapping unit constituting the internal trapping tower of the apparatus for trapping of a reaction by-product includes: the plurality of planar cross-shaped vertical plates arranged in a quadrangular shape at predetermined intervals in the circumferential direction of the intermediate trapping unit constituting the internal trapping tower having multiple stages; and the planar inner cross-shaped vertical plate provided at the lower center of the inner region so that trapping occurs. Further, each of the planar cross-shaped vertical plates defining the periphery is formed so that the upper side thereof has the large inner region area and the lower side thereof has the large outer region area, such that the available trapping region has the trapping space in which the lower space of the inner region is larger than the upper space of the inner region. In this state, the introduced gas quickly flows downward without a load while being guided along the planar shape, the reaction by-product is trapped in the inner region of the planar cross-shaped vertical plates and the inner cross-shaped vertical plate and then accumulated in the space of the inner region during the former part of the use duration time, and the gas flows downward along the outer surface of the planar cross-shaped vertical plate so that the additional trapping reaction occurs during the latter part of the use duration time, such that the trapping reaction occurs by expanding the available trapping region.

In addition, according to the present disclosure, in the intermediate trapping unit constituting the internal trapping tower of the apparatus for trapping of a reaction by-product, the gas discharged outward flows to the lower end trapping unit. The vortex plates are installed in multiple stages along an outer lower periphery of the intermediate trapping unit and used, such that the vortex is generated by reducing a flow velocity of the gas flowing downward after being discharged to the outside of the intermediate trapping unit, thereby performing the trapping reaction while increasing the trapping reaction time and preventing the trapped reaction by-product from leaking.

In addition, according to the present disclosure, the gas introduced into the upper end trapping unit constituting the internal trapping tower of the apparatus for trapping of a reaction by-product flows into the intermediate trapping unit through the main gas hole. The triangular plate having an inclination angle increasing from the outer periphery toward the central portion is provided so that the gas flowing downward after being distributed to the outer periphery from the heater smoothly flows into the central portion from the outer periphery of the upper end trapping unit, such that the trapping reaction is performed while guiding the flow of the gas. The gas having passed through the auxiliary gas holes formed around the main gas hole performs the trapping reaction again while the quadrangular plate formed on the lower surface induces the downward flow.

In addition, according to the present disclosure, the gas discharged from the intermediate trapping unit constituting the internal trapping tower of the apparatus for trapping of a reaction by-product passes through the lower end trapping unit having the multiple stages, such that the trapping reaction is performed in multiple stages, the leak of the trapped reaction by-product is prevented, and only the gas is discharged to the discharge port.

In addition, according to the present disclosure, the plurality of filtering plates is provided along the periphery of the discharge port and protrudes in the oblique direction, thereby preventing a leak of the reaction by-product trapped while passing through the lower end trapping unit having the multiple stages.

The present disclosure is a useful invention having many advantages as described above and is an invention that is highly expected to be used in industries.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Hereinafter, configurations and operations of embodiments of the present disclosure will be described in detail with reference to the accompanying drawings. In addition, in the description of the present disclosure, the specific descriptions of related well-known functions or configurations will be omitted when it is determined that the specific descriptions may unnecessarily obscure the subject matter of the present disclosure.

Figure 1:
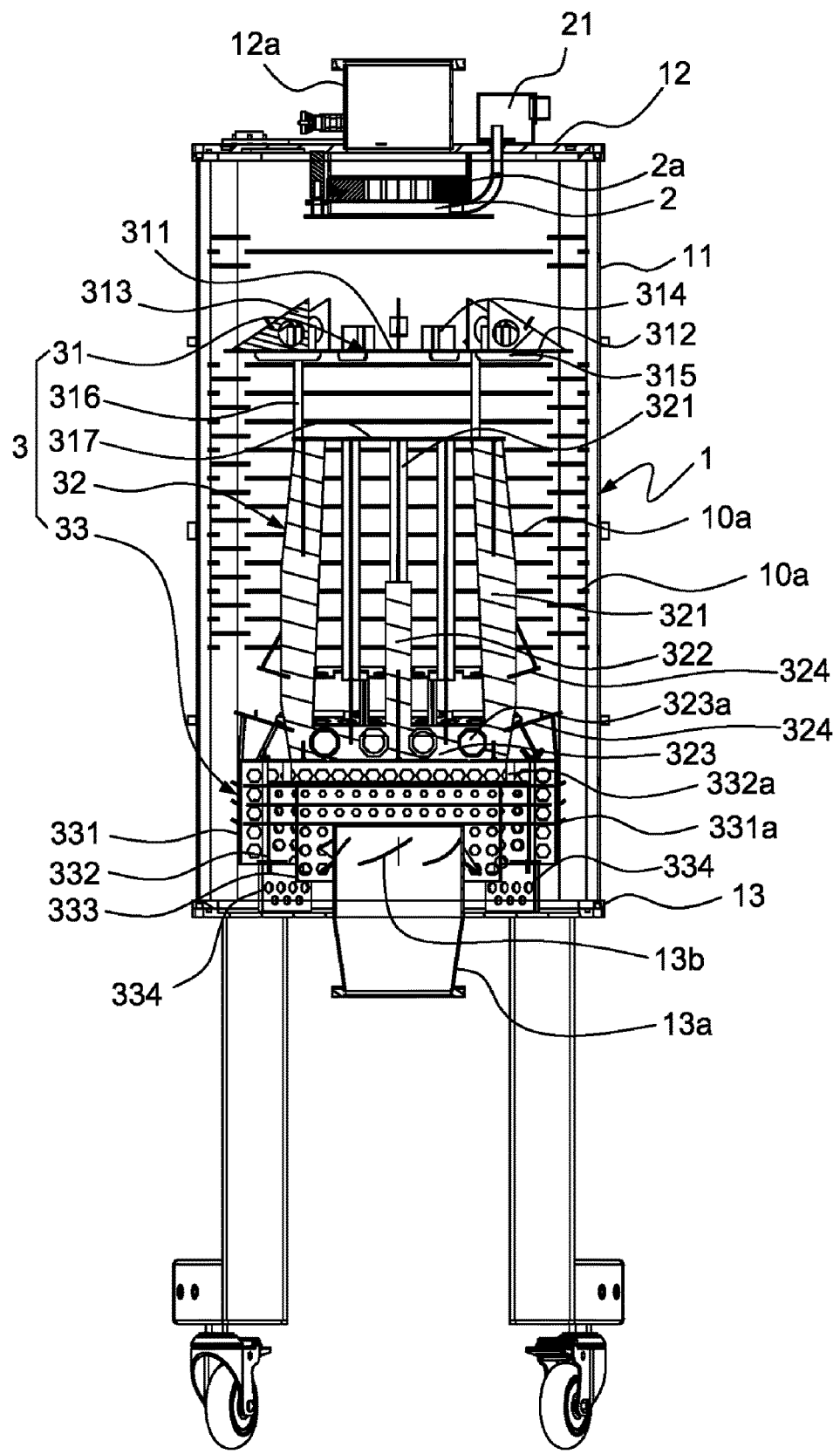
FIG. 1 is a cross-sectional view illustrating an internal configuration of an apparatus for trapping of a reaction by-product according to an embodiment of the present disclosure.
Figure 2:
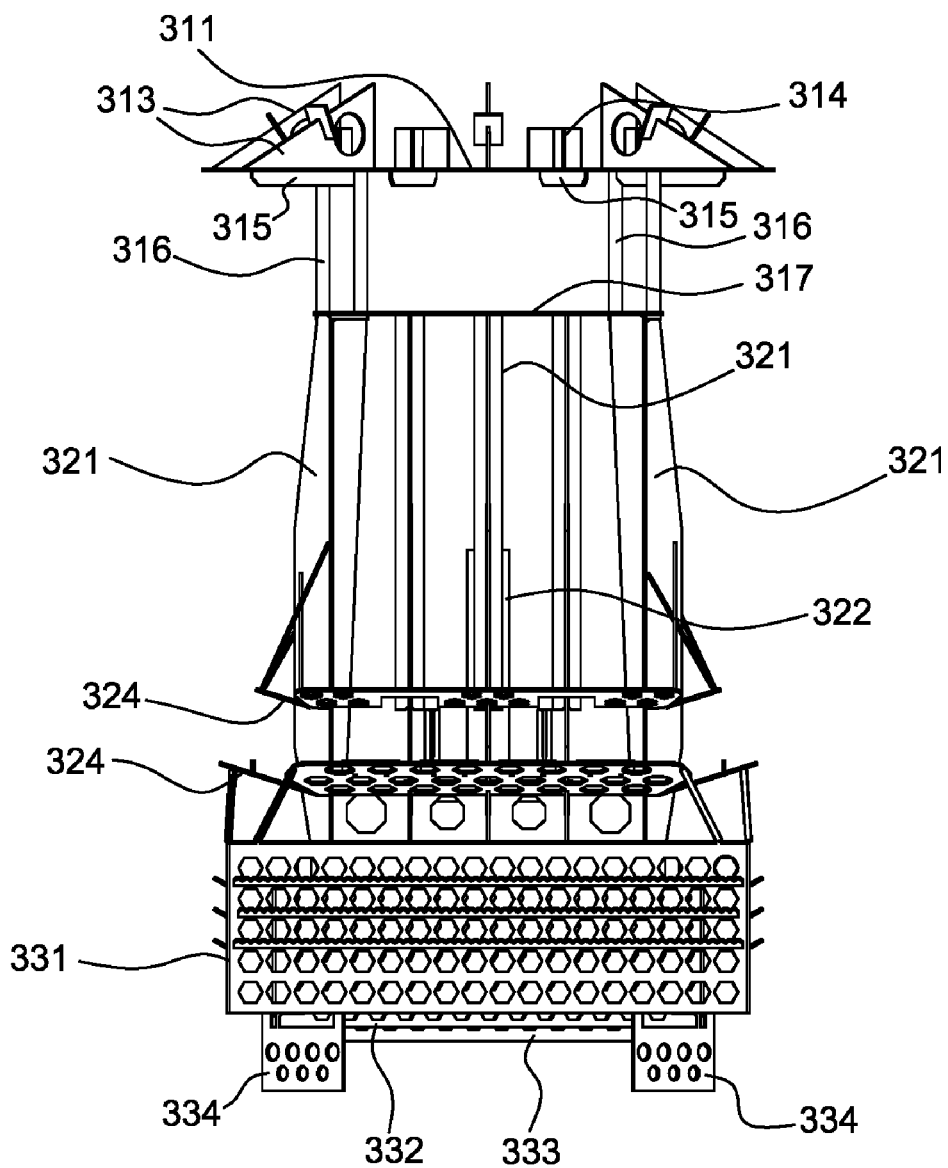
FIG. 2 is a front view illustrating an entire assembled structure of an internal trapping tower according to the embodiment of the present disclosure.
Figure 3:
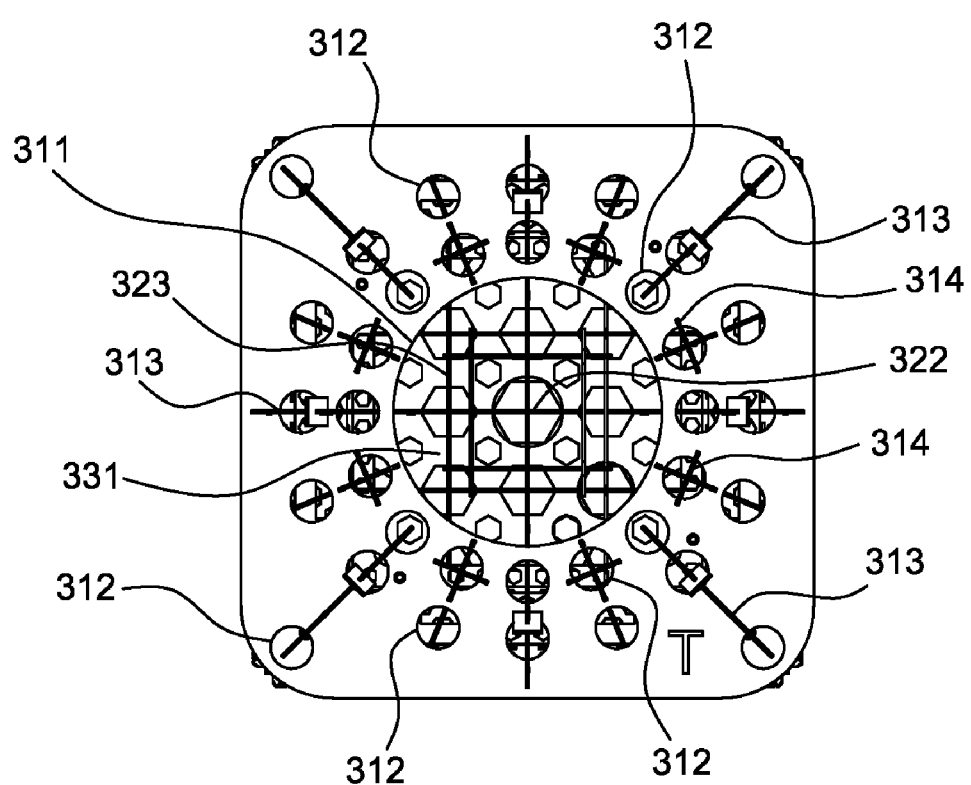
FIG. 3 is a top plan view of the internal trapping tower according to the embodiment of the present disclosure.
Figure 4:
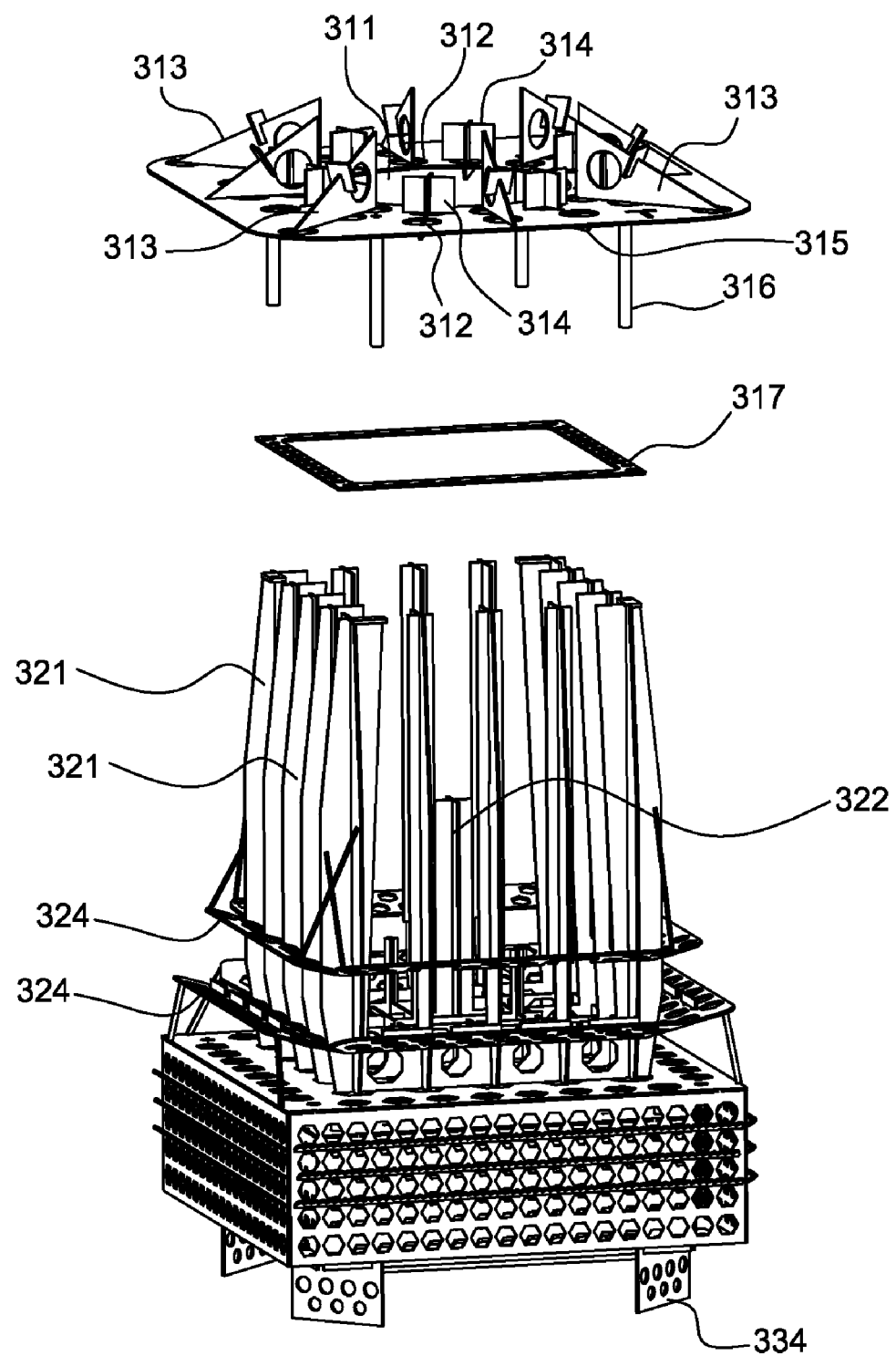
FIG. 4 is a partially exploded perspective view of the internal trapping tower according to the embodiment of the present disclosure.
Figure 5:
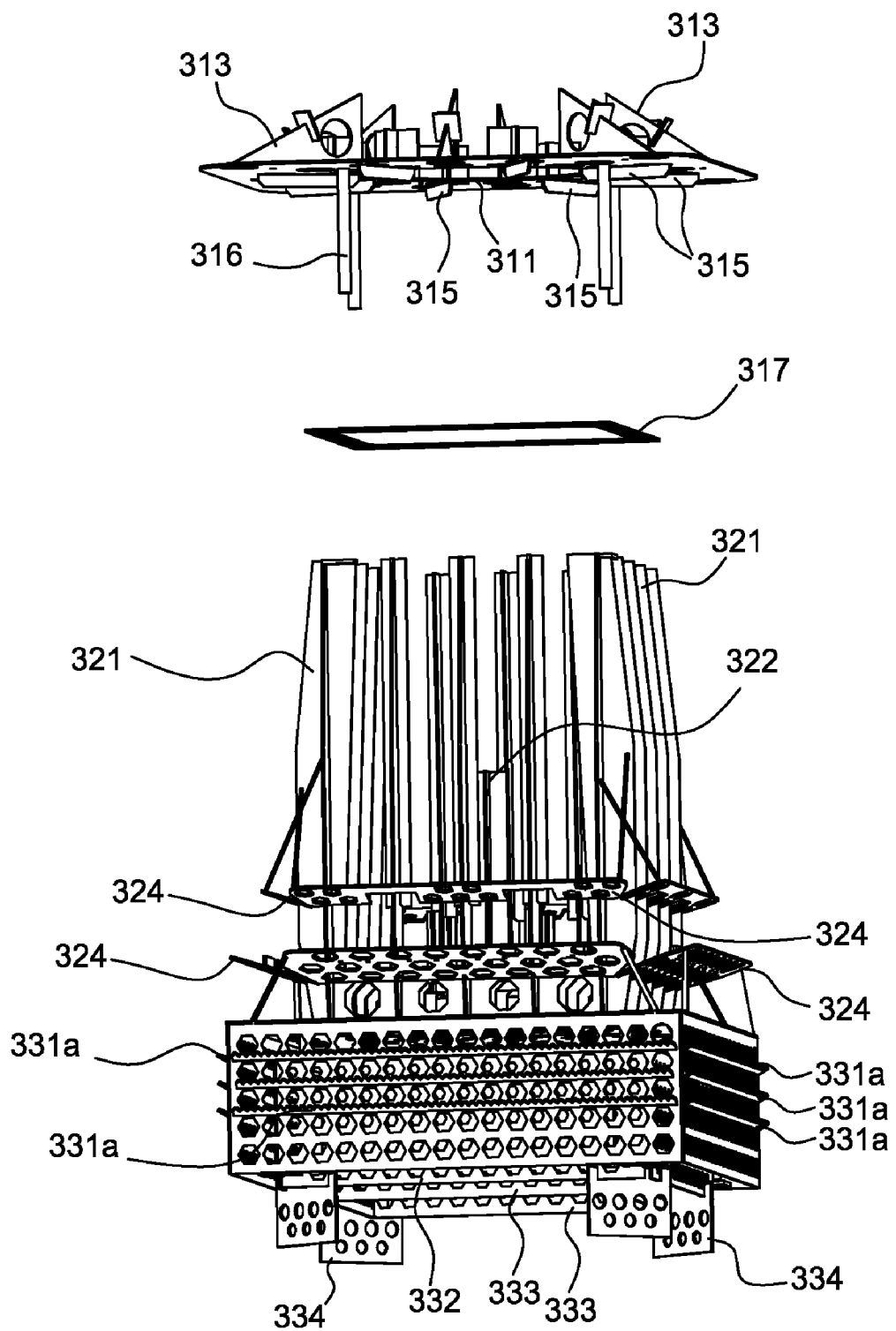
FIG. 5 is a partially exploded perspective view of the internal trapping tower according to the embodiment of the present disclosure when viewed from below.
Figure 6:
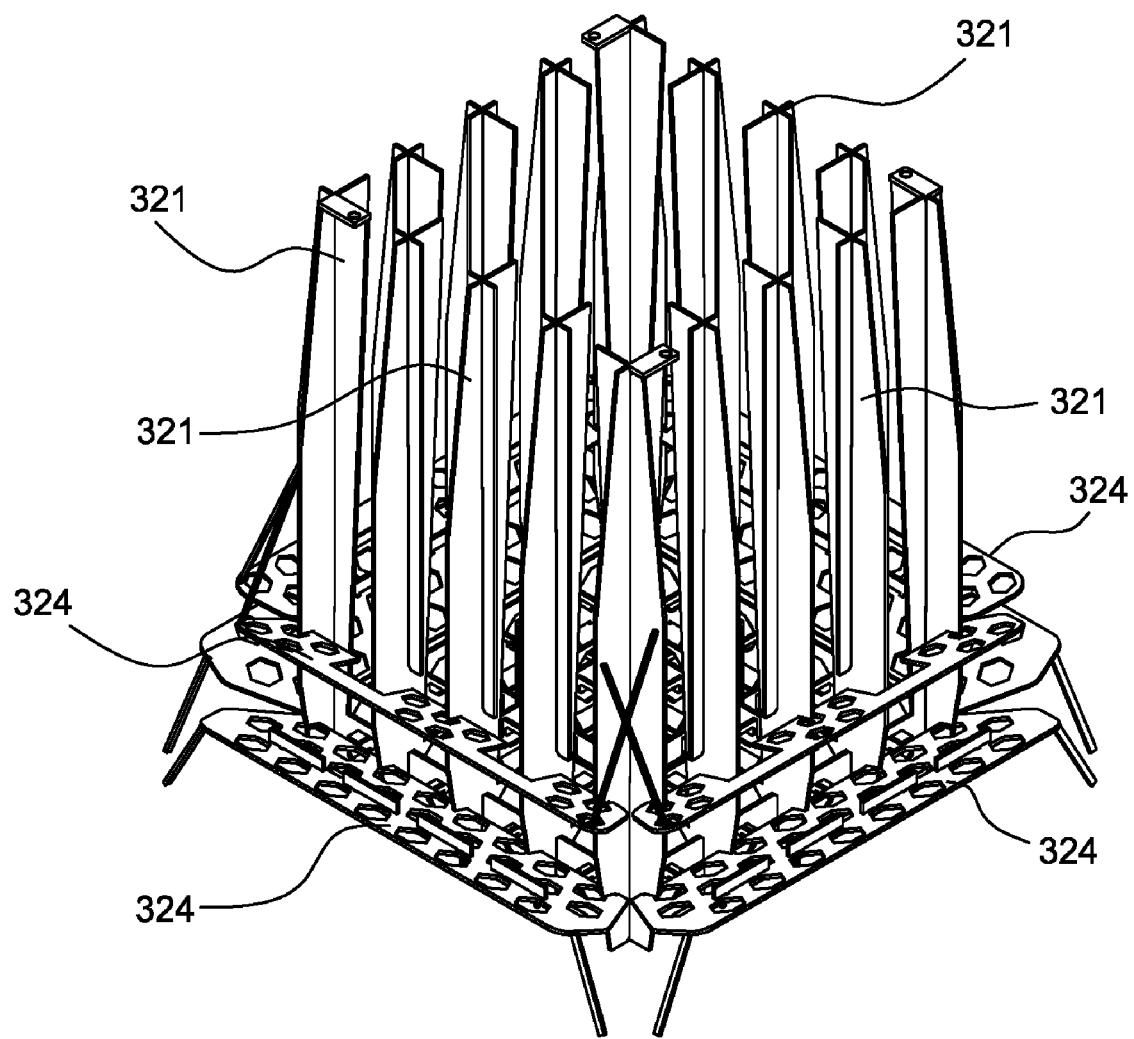
FIG. 6 is a perspective view of an intermediate trapping unit according to the embodiment of the present disclosure.
Figure 7:
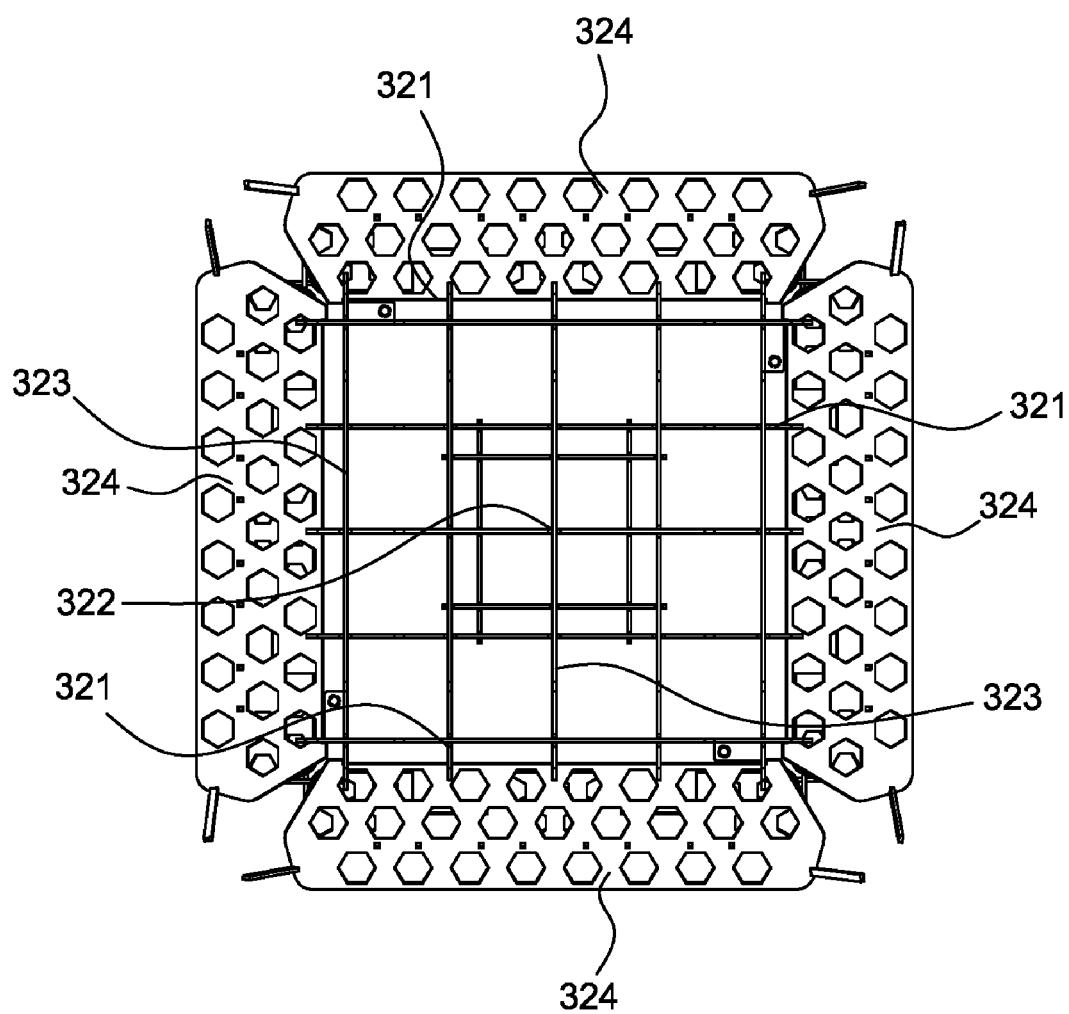
FIG. 7 is a bottom plan view of the intermediate trapping unit according to the embodiment of the present disclosure.
Figure 8:
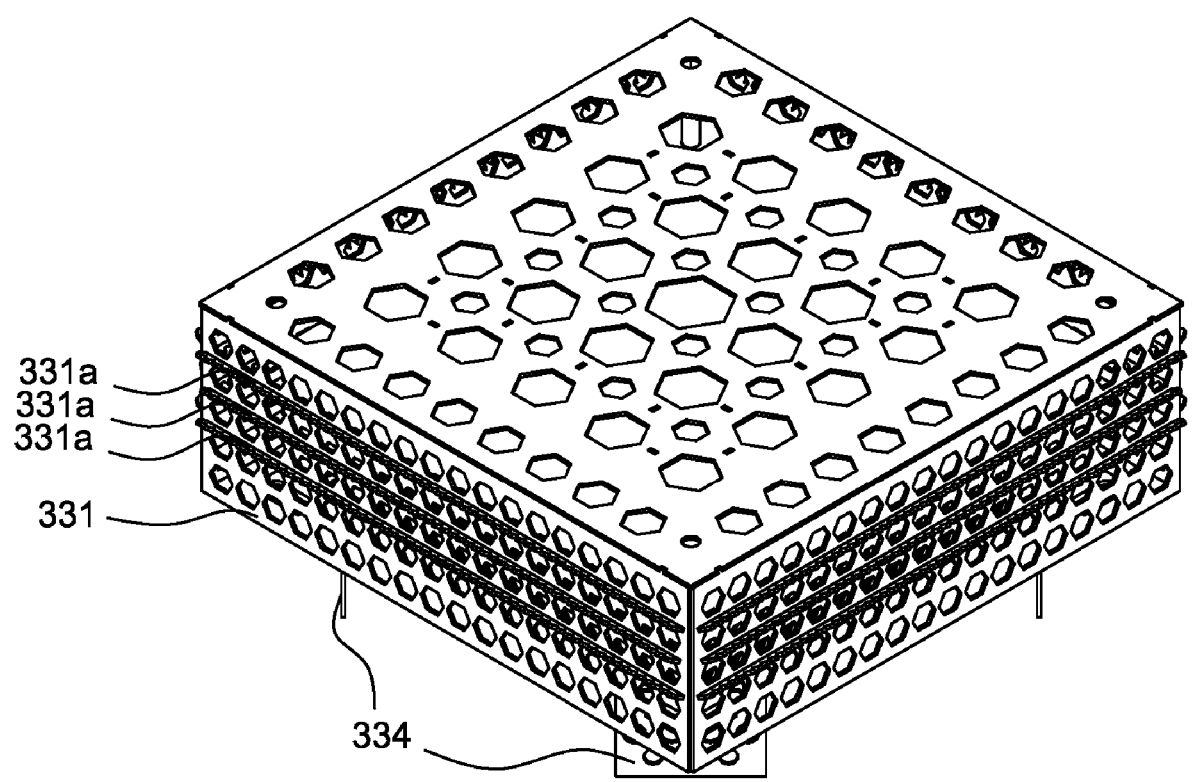
FIG. 8 is a perspective view of a lower end trapping unit according to the embodiment of the present disclosure.
Figure 9:
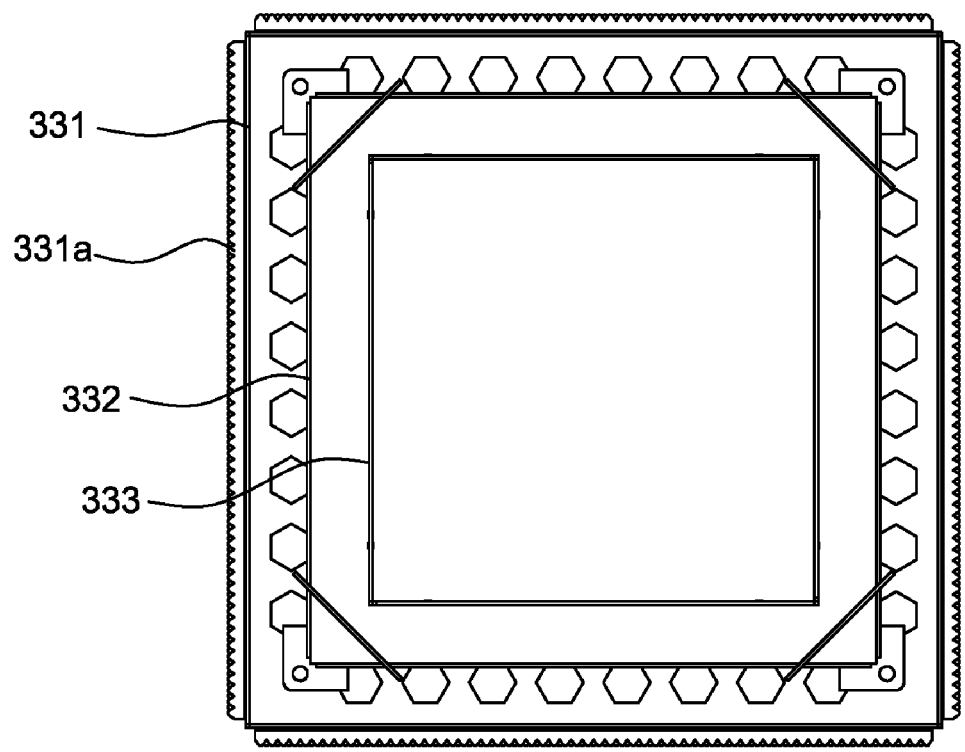
FIG. 9 is a bottom plan view of the lower end trapping unit according to the embodiment of the present disclosure.

FIG. 1 is a cross-sectional view illustrating an internal configuration of an apparatus for trapping of a reaction by-product according to an embodiment of the present disclosure, FIG. 2 is a front view illustrating an entire assembled structure of an internal trapping tower according to the embodiment of the present disclosure, FIG. 3 is a top plan view of the internal trapping tower according to the embodiment of the present disclosure, FIG. 4 is a partially exploded perspective view of the internal trapping tower according to the embodiment of the present disclosure, FIG. 5 is a partially exploded perspective view of the internal trapping tower according to the embodiment of the present disclosure when viewed from below, FIG. 6 is a perspective view of an intermediate trapping unit according to the embodiment of the present disclosure, FIG. 7 is a bottom plan view of the intermediate trapping unit according to the embodiment of the present disclosure, FIG. 8 is a perspective view of a lower end trapping unit according to the embodiment of the present disclosure, and FIG. 9 is a bottom plan view of the lower end trapping unit according to the embodiment of the present disclosure.

As illustrated, an apparatus for trapping of a reaction by-product capable of expanding the area for collection by inducing a gas flow according to the present disclosure refers to an apparatus that traps a reaction by-product, which is contained in non-reacted gas discharged after a thin film deposition process in a process chamber (not illustrated), and then discharges only the remaining gas to a rear end of the apparatus for trapping of a reaction by-product.

A configuration of the apparatus for trapping of a reaction by-product includes: a housing 1 configured to accommodate gas, which is discharged after a deposition process during a semiconductor manufacturing process, and discharge the gas; a heater 2 configured to heat the gas accommodated in the housing; and an internal trapping tower 3 configured to trap, in multiple stages, the reaction by-product from the gas introduced into the housing and then heated in the housing according to height, the internal trapping tower 3 including: an upper end trapping unit 31 configured to perform a trapping reaction while guiding a main flow of gas to a central portion and moving the gas downward according to the height; an intermediate trapping unit 32 having a structure having an inner region is formed as a space portion so as to accommodate the introduced gas and trap the reaction by-product; and a lower end trapping unit 33 configured to prevent a leak of the trapped reaction by-product while trapping, in multiple stages, the reaction by-product from the gas introduced through a lateral side. The upper end trapping unit 31, the intermediate trapping unit 32, and the lower end trapping unit 33 are separated provided.

In particular, in the intermediate trapping unit 32 of the internal trapping tower 3, depending on a change in trapping amount according to an elapse of a use duration time, a main flow of the gas is guided so that the gas flows toward an outer region after flowing downward to an inner region of planar cross-shaped vertical plates 321 defining a periphery during a former part of the use duration time, and the gas is guided to flow downward after flowing to the outer region of the planar cross-shaped vertical plates 321 from an upper side of the inner region during a latter part of the use duration time, such that an additional trapping reaction is performed.

In one embodiment, the deposition process may be a TiN deposition process performed by inputting $TiCl_4$, $NH_3$ gas into a process chamber. However, the present disclosure is not limited to an apparatus for trapping of a reaction by-product used only for the deposition process using the TiCl4, NH3 gas. Various semiconductor manufacturing processes may of course trap the reaction by-product contained in various gases discharged after being supplied to the process chamber.

Hereinafter, the respective components will be described in more detail.

The housing 1 is configured vertically to receive and accommodate the gas discharged from the process chamber when the gas is introduced into an upper portion of the housing 1. The housing 1 is also configured to discharge the gas to a lower portion of the housing 1. The housing 1 includes a housing main body 11 configured to accommodate the introduced gas, an upper plate 12 having a gas inlet port 12a protruding upward, and a lower plate 13 having a gas discharge port 13a protruding in two upward and downward directions.

In addition, like the embodiment illustrated as necessary, the housing may further include support legs and driving rollers provided on a lower portion of the lower plate and configured to allow the apparatus for trapping of a reaction by-product to move.

The housing main body 11 according to the embodiment of the present disclosure is illustrated as having a quadrangular column shape. However, the present disclosure is not limited only to the above-mentioned shape, and the housing main body 11 may of course have a necessary shape such as a cylindrical shape and polygonal column shape.

The housing main body 11 has a plurality of wall surface plates 10a installed in a horizontal direction for each inner wall and arranged at predetermined intervals in a vertical direction. The wall surface plates 10a trap the reaction by-product while increasing the time for which the gas remains in an internal space of the housing by generating vortices of the gas passing through the interior of the housing 1.

In one embodiment, a cross-sectional shape of the wall surface plate 10a is a flat plate shape having a horizontal shape. However, in addition to the above-mentioned shape, the wall surface plate 10a may have an inclined surface made by bending an inner end of the wall surface plate 10a upward or downward, or the wall surface plate 10a may be rounded. The wall surface plate having the above-mentioned shape acts as a load against a downward flow of the gas and generates the vortex made by differences in directions and velocities. Therefore, the wall surface plate traps the reaction by-product while increasing the time for which the gas remains in the internal space.

The gas discharge port 13a may protrude upward from the lower plate 13, and a plurality of filtering plates 13b may be disposed along a periphery of the gas discharge port 13a and protrude in an oblique direction. The plurality of filtering plates 13b may be arranged at predetermined intervals. When the filtering plates 13b are formed as described above, the gas flowing upward along a wall surface of the gas discharge port 13a collides with the filtering plates 13b, and thus vortices occur. The vortices delay the discharge timing at most so that the gas having passed through the lower end trapping unit with the multiple stages cannot flow directly into the gas discharge port, thereby preventing the trapped reaction by-product from being mixed with the gas and leaking together with the gas.

The heater 2 heats the gas introduced into the housing and forms a part of a temperature zone at an upper end of the housing, and the trapping cannot be performed in the temperature zone. Therefore, it is possible to prevent a situation in which the by-product is accumulated in the upper end of the housing and the gas inlet port 12a and the upper end of the housing and the gas inlet port 12a are clogged at initial using time. As a means for uniformly distributing the gas, heat radiating fins 2a are radially provided above the heater, thereby uniformly distributing the heated gas.

In addition, a heater power supply unit 21 is installed on the upper plate 12 of the housing, supplies power to the heater 2, and measures a temperature for controlling a power supply source on the basis of an internal temperature of the housing.

The internal trapping tower 3 has a structure in which the trapping regions are divided into the upper end trapping unit 31, the intermediate trapping unit 32, and the lower end trapping unit 33, such that the internal trapping tower 3 traps the reaction by-product in the multiple stages from the gas introduced into the housing. In particular, the intermediate trapping unit is configured to maximize the overall trapping efficiency by expanding the available trapping region by changing the main flow of the gas from the inner region to the outer region depending on the change in trapping amount according to the elapse of the use duration time.

The upper end trapping unit 31 guides the gas, which is distributed in a direction from the heater toward an outer periphery in the housing and flows downward, to the intermediate trapping unit 32 through a main gas hole 311 formed in a central portion and relatively small auxiliary gas holes 312 circularly arranged around the main gas hole 311. The intermediate trapping unit 32 is disposed below the upper end trapping unit 31 and spaced apart from the upper end trapping unit 31 at a predetermined interval. The upper end trapping unit 31 includes an upper surface, a lower surface, and a trapping plate having various shapes and installed between the upper surface and the lower surface by a fastening method such as fitting or welding and traps the reaction by-product contained in the gas.

Specifically, the upper end trapping unit 31 is provided in the form of a flat plate having a quadrangular shape and slightly smaller than an inner wall of an upper end of the housing main body to maximally block the internal space. Therefore, the gas, which is distributed from the heater 2, which is positioned at the upper side, toward the outer periphery of the internal space of the housing and moved downward, is not directly moved downward but guided to the main gas hole 311 formed in the central portion, such that the gas has a main flow. Further, a part of the gas is guided to the plurality of relatively small auxiliary gas holes 312 circularly arranged in multiple rows around the main gas hole 311, such that the gas has an auxiliary flow. Therefore, the trapping reaction is performed while the gas is distributed as described above.

Triangular plates 313 are radially arranged on an upper surface of the upper end trapping unit 31 and vertically protrude while traversing the plurality of auxiliary gas holes 312 circularly arranged in multiple rows. Cross-shaped plates 314 are disposed between the triangular plates 313 and vertically protrude while traversing the auxiliary gas holes 312. The cross-shaped plates 314 are radially arranged to guide the gas flow and generate vortices, thereby improving trapping efficiency. Quadrangular plates 315 are radially arranged on a lower surface of the upper end trapping unit 31 and vertically protrude while traversing the auxiliary gas holes 312, thereby performing the trapping while guiding the uniform downward flow of the exhaust gas moving downward through the main gas hole 311 and the auxiliary gas holes 312.

In addition, the triangular plate 313 is formed such that an inclination thereof increases from the outer periphery toward the main gas hole, such that the gas introduced into the outer periphery may be smoothly guided toward the main gas hole 311 disposed at the inner side of the upper end trapping unit 31.

In addition, a vortex piece may be further and selectively disposed perpendicularly at an upper end of the triangular plate 313, and a gas hole may be further formed to penetrate the plate, thereby improving efficiency in generating the vortex.

In addition, the upper end trapping unit 31 is spaced apart from the intermediate trapping unit 32 at a predetermined height by a support unit 317 and spacers 316 having a predetermined length and installed on a lower portion of the upper end trapping unit 31. The support unit 317 is provided in the form of a band-shaped plate having a predetermined width along an upper-end shape of the intermediate trapping unit 32 so that four or more spacers are fixed to the support unit 317. The support unit 317 has a plurality of holes, such that two opposite sides thereof are fixed by screw-coupling or welding.

The intermediate trapping unit 32 has a structure in which an inner region is formed as a space portion so as to trap the reaction by-product while accommodating the gas introduced into the central portion from the upper end trapping unit 31. To this end, a plurality of planar cross-shaped vertical plates 321 is coupled to a lower portion spaced apart from the upper end trapping unit at a predetermined interval, and the plurality of planar cross-shaped vertical plates 321 is disposed to be spaced apart from one another to have gaps at predetermined intervals and defines a quadrangular periphery. A planar inner cross-shaped vertical plate 322 having a relatively smaller size than the cross-shaped vertical plate 321 is provided at a lower center of an inner region of the cross-shaped vertical plates 321 that defines the periphery.

In addition, an exhaust plate 323 is provided below the planar cross-shaped vertical plates 321 and the inner cross-shaped vertical plate 322 and has a plurality of gas holes 323a through which the gas introduced into a lower side in the inner region is discharged to the outer region.

The exhaust plate 323 may be only formed below the planar cross-shaped vertical plates 321 and the inner cross-shaped vertical plate 322 that at least constitute the periphery.

In addition, as another embodiment, the exhaust plate 323 has a lattice shape so that the planar cross-shaped vertical plates 321 and the inner cross-shaped vertical plate 322 implement a cross shape by fitting between the planar plates. Therefore, when the intermediate trapping unit 32 is assembled, the plurality of exhaust plates 323 disposed below the respective plates is also assembled in a lattice shape.

In addition, the planar cross-shaped vertical plate 321 is formed such that an area in which the planar cross-shaped vertical plate 321 protrudes toward the inner region is large at the upper side, and an area in which the planar cross-shaped vertical plate 321 protrudes toward the outer region is large at the lower side. Therefore, a trapping space is formed such that a lower space in the inner region is larger than an upper space in the inner region. That is, based on a planar cross-section having a cross shape, the areas of the plate protruding inward and outward based on the plate formed in the circumferential direction are different from one another depending on the height. The area of the plate protruding inward is large at the upper side and small at the lower side, and the area of the plate protruding outward is large at the lower side and small at the upper side.

The above-mentioned configuration enables more consistent trapping in comparison with a case in which the upper space and the lower space are identical to each other.

In addition, since the area in which the planar cross-shaped vertical plates 321 protrude toward the inner region is large at the upper side, the trapping reaction is performed on a large amount of gas in the main gas flow during the former part of the use duration time, such that the reaction by-product is accumulated in a large lower space. Since the area in which the planar cross-shaped vertical plates 321 protrude toward the outer region is larger at the lower side, the trapping reaction is performed on a large amount of gas flowing downward through the outer region during the latter part of the use duration time.

Unlike the above-mentioned configuration, if the intermediate trapping unit is formed such that the upper and lower trapping spaces are identical to each other, there is a high likelihood that the upper side is clogged first as the trapping reaction is performed, which may cause deterioration in trapping efficiency.

In addition, the planar cross-shaped vertical plate 321 has a planar shape without a gas hole formed in the plate to allow the gas to flow. Therefore, the introduced gas may quickly flow downward along the planar shape without a load unlike the trapping plate in the related art that has a plurality of gas holes having the same size or different sizes.

In addition, the apparatus for trapping of a reaction by-product may further include vortex plates 324 disposed below the outer region of the planar cross-shaped vertical plates 321, installed along a periphery of the outer region of the planar cross-shaped vertical plates 321, and having a plurality of gas holes 324a. In this case, the vortex plate 324 may be inclined so that an outer side thereof is high.

In addition, the vortex plates 324 installed along the periphery may be installed in multiple stages vertically. In this case, the vortex plate 324 at a lower stage may be relatively larger, such that the vortex plates 324 disposed in the multiple stages may improve efficiency in generating the vortex and prevent the trapped reaction by-product from being dropped downward and leaking through the gas discharge port 13a.

The vortex plates 324 may be fitted into grooves formed in surfaces of the cross-shaped vertical plates 321 or welded to the cross-shaped vertical plates 321. The vortex plates 324 may be fixed by welding or the like by connecting a support member to the cross-shaped vertical plates or the lower end trapping unit in order to support the inclined structure.

Since the vortex plates 324 are configured as described above, a flow velocity of the gas moving downward after being discharged to the outside of the intermediate trapping unit is reduced, the vortex is generated, and the trapping reaction time is increased during the latter part of the use duration time. Therefore, it is possible to prevent the trapped and accumulated reaction by-product from being dropped and leaking to the gas discharge port.

The intermediate trapping unit may be manufactured in various forms according to the following embodiments.

In one embodiment, although not illustrated in the drawings, a quadrangular periphery is configured by the plurality of separate planar cross-shaped vertical plates 321, the one or more inner cross-shaped vertical plates 322 are provided and disposed inside the plurality of separate planar cross-shaped vertical plates 321, and then the exhaust plate 323 is welded or fitted below the plurality of planar cross-shaped vertical plates 321 and the inner cross-shaped vertical plate 322 so that the plurality of planar cross-shaped vertical plates 321, the inner cross-shaped vertical plate 322, and the exhaust plate 323 are integrated with one another.

As another embodiment, a single plate having a single surface is provided and configured in a lattice shape, and the plates are perpendicularly fitted in a cross shape at a central portion, thereby constituting the planar cross-shaped vertical plate 321, the inner cross-shaped vertical plate 322, and the exhaust plate 323.

That is, a plurality of plates constituting one side of the cross-shaped vertical plates 321 protrudes upward from an upper surface of a part of the exhaust plate 323, a plate constituting one side of the cross-shaped vertical plate 321 protrudes upward from an upper end of a part of the exhaust plate 323, a plate constituting one side of the cross-shaped vertical plate 321 protrudes upward from an upper end of the exhaust plate 323, and a plate constituting one side of the inner cross-shaped vertical plate 322 protrudes upward from a middle portion of the exhaust plate 323. As described above, the plates intersect one another and are fitted in a lattice shape into a plurality of fitting grooves formed in the exhaust plates 323 having different shapes, thereby constituting the cross-shaped vertical plates 321, the inner cross-shaped vertical plate 322, and the exhaust plate 323. When the plates are completely fitted, the plates are finally welded and fixed.

In the intermediate trapping unit 32 configured as described above, during the former part of the use duration time, the main flow of the gas flows to the lower side of the central portion in the inner region of the planar cross-shaped vertical plates 321 defining the periphery and then be discharged to the outer region through the exhaust plate 323. The reaction by-product contained in the gas is trapped by the inner region of the planar cross-shaped vertical plates 321 and the inner cross-shaped vertical plate 322 and coagulated and accumulated in the space portion in the inner region. During the latter part of the use duration time when the reaction by-product is accumulated in the space portion in the inner region and the trapping space is reduced, the plurality of gas holes 323a formed in the exhaust plate 323 is clogged, such that it is difficult to discharge the gas through the plurality of gas holes 323a. Therefore, the main flow of the gas is guided to the outer region through the space between the plurality of planar cross-shaped vertical plates 321, which is installed at predetermined intervals and defines the periphery, such that the reaction by-product is trapped in the outer region of the planar cross-shaped vertical plates 321. That is, when the amount of trapped reaction by-product increases, the gas flows to the outer region through the space at the upper side of the planar cross-shaped vertical plates 321 and then flows downward, such that the additional trapping reaction occurs in the outer region of the planar cross-shaped vertical plates 321.

During the process of trapping the reaction by-product from the main flow of the gas, by the configuration in which the area in which the planar cross-shaped vertical plates 321 protrude toward the inner region is large at the upper side and the area in which the planar cross-shaped vertical plates 321 protrude toward the outer region is large at the lower side, the reaction by-product is trapped at the upper side in the inner region and accumulated in the large space at the lower side during the former part of the use duration time, and the gas flows downward in the outer region and the amount of trapped reaction by-product increases during the latter part of the use duration time.

In addition, by the vortex plates 324 having the plurality of holes and installed along the periphery of the lower side of the outer region of the plurality of planar cross-shaped vertical plates 321 defining the periphery, a flow velocity of the gas moving downward after being discharged to the outside of the intermediate trapping unit is reduced, the vortex is generated, and the trapping reaction time is increased during the latter part of the use duration time. Further, the vortex plates 324 prevent the trapped and accumulated reaction by-product from being dropped and leaking to the gas discharge port.

The lower end trapping unit 33 is connected to the lower portion of the intermediate trapping unit 32 and includes an outer periphery trapping plate part 331, an intermediate trapping plate part 332, and an inner trapping plate part 333 which have a plurality of gas holes formed in surfaces thereof and are disposed in multiple stages. The lower end trapping unit 33 prevents the gas, which has experienced the trapping reaction in the inner region and the outer region of the intermediate trapping unit 32, from flowing downward directly into the gas discharge port 13a provided on the lower plate of the housing. Therefore, the gas is guided toward the inner side from the outer periphery, such that the trapping reaction is finally performed. Further, the flow of the gas is guided so that the gas flows into the upper side of the gas discharge port 13a protruding upward from the central portion of the lower plate of the housing and then flows downward.

In addition, the lower end trapping unit 33 is installed on the lower plate of the housing and connects the adjacent plates at the lower end of the intermediate trapping plate part of the lower end trapping unit 33. The lower end trapping unit 33 supports an overall load of the intermediate trapping unit 32 in a state in which the lower end trapping unit 33 floats by being fastened to support plates 334 having a plurality of gas holes formed in surfaces thereof, thereby allowing the gas to smoothly flow in and autonomously trapping the reaction by-product in the gas.

The lower end trapping unit 33 including the outer periphery trapping plate part 331, the intermediate trapping plate part 332, and the inner trapping plate part 333, which are disposed in the multiple stages, may each have a lower end that becomes closer to the lower plate of the housing in a direction from the outer peripheral trapping plate part 331 to the inner trapping plate part 333 so that the introduced gas sequentially flows in.

The lower end trapping unit 33 according to one embodiment will be more specifically described below.

The outer peripheral trapping plate part 331 has a quadrangular column structure (a cylindrical shape or a polygonal column shape may be applied) opened at a lower side thereof and includes an upper trapping plate and lateral trapping plates that have a plurality of gas holes equal in size to one another.

In this case, a plurality of vortex generating pieces 331a is installed along the outer surface of the outer periphery trapping plate part 331 and vertically arranged in multiple stages, and the plurality of vortex generating pieces 331a is inclined upward at an inclination angle toward the outside.

The vortex generating piece 331a generates the vortex while guiding the flow of the gas, which flows downward from the upper side, to the inside, thereby improving trapping efficiency. To this end, the outer end of the vortex generating piece 331a may have a continuous semi-circular shape or a concave-convex shape in a longitudinal direction, thereby improving efficiency in generating the vortex. In addition, the vortex generating piece 331a may prevent the trapped and accumulated reaction by-product from being dropped and leaking to the gas discharge port.

The intermediate trapping plate part 332 has a quadrangular column structure (a cylindrical shape or a polygonal column shape may be applied) opened at a lower side thereof. The intermediate trapping plate part 332 is spaced apart from the upper surface of the outer peripheral trapping plate part 331 at a predetermined interval by spacers 332a and includes an upper trapping plate and lateral trapping plates. The upper trapping plate has a closed structure. Each of the lateral trapping plates has a plurality of gas holes, the lower hole is large, and the upper hole is small, such that a main flow of the gas may be formed downward. In this case, the hole formed in the intermediate trapping plate part 332 may be smaller than the hole formed in the outer peripheral trapping plate part 331, thereby enabling a smooth flow of the gas and a smooth trapping reaction.

The inner trapping plate part 333 has a quadrangular column structure (a cylindrical shape or a polygonal column shape may be applied) opened at upper and lower sides thereof. The inner trapping plate part 333 is fastened and fixed to the intermediate trapping plate part by welding or the like and includes lateral trapping plates having a plurality of gas holes. The lower hole is large, and the upper hole is small, such that a main flow of the gas may be formed downward. In this case, the hole formed in the inner trapping plate part 333 may be smaller than the hole formed in the outer peripheral trapping plate part 331, thereby enabling a smooth flow of the gas and a smooth trapping reaction.

According to the internal trapping tower 3 according to the present disclosure configured as described above, the main flow of the gas introduced into the housing is collected in the central portion of the upper end trapping unit 31 of the internal trapping tower 3 and sent to the intermediate trapping unit 32 disposed below the upper end trapping unit 31. In the intermediate trapping unit 32 having the inner region formed as the space portion, the main flow of the gas flows quickly downward along the inner region of the planar cross-shaped vertical plates 321 defining the quadrangular periphery, and the gas has a main gas flow that produces the reaction by-product while performing the trapping reaction on the planar cross-shaped vertical plates 321 and the inner cross-shaped vertical plate 322 and then is discharged to the outer region through the exhaust plate 323 positioned at the lower side.

The reaction by-product trapped by the planar cross-shaped vertical plates 321 and the inner cross-shaped vertical plate 322 is accumulated in the internal space, i.e., the inner region. In this case, the planar inner cross-shaped vertical plate is installed at the lower center of the inner region, thereby improving trapping efficiency in the inner region.

Thereafter, during the latter part of the use duration time when the trapping space is reduced by the reaction by-product trapped and accumulated in the inner region of the planar cross-shaped vertical plates, the gas flow is guided to the outer region from the upper side of the planar cross-shaped vertical plates, such that the gas flows downward, and the reaction by-product is additionally trapped.

In addition, during the former part of the use duration time or the latter part of the use duration time, the gas discharged outward from the intermediate trapping unit 32 flows downward, and the lower end trapping unit 33 including the outer periphery trapping plate part 331, the intermediate trapping plate part 332, and the inner trapping plate part 333, which are disposed in the multiple stages and configured to guide the flow of gas, finally traps the reaction by-product contained in the gas while preventing a leak of the reaction by-product. Further, the gas flows into the upper side of the gas discharge port 13a protruding upward from the central portion of the lower plate of the housing and then is discharged.

Figure 10:
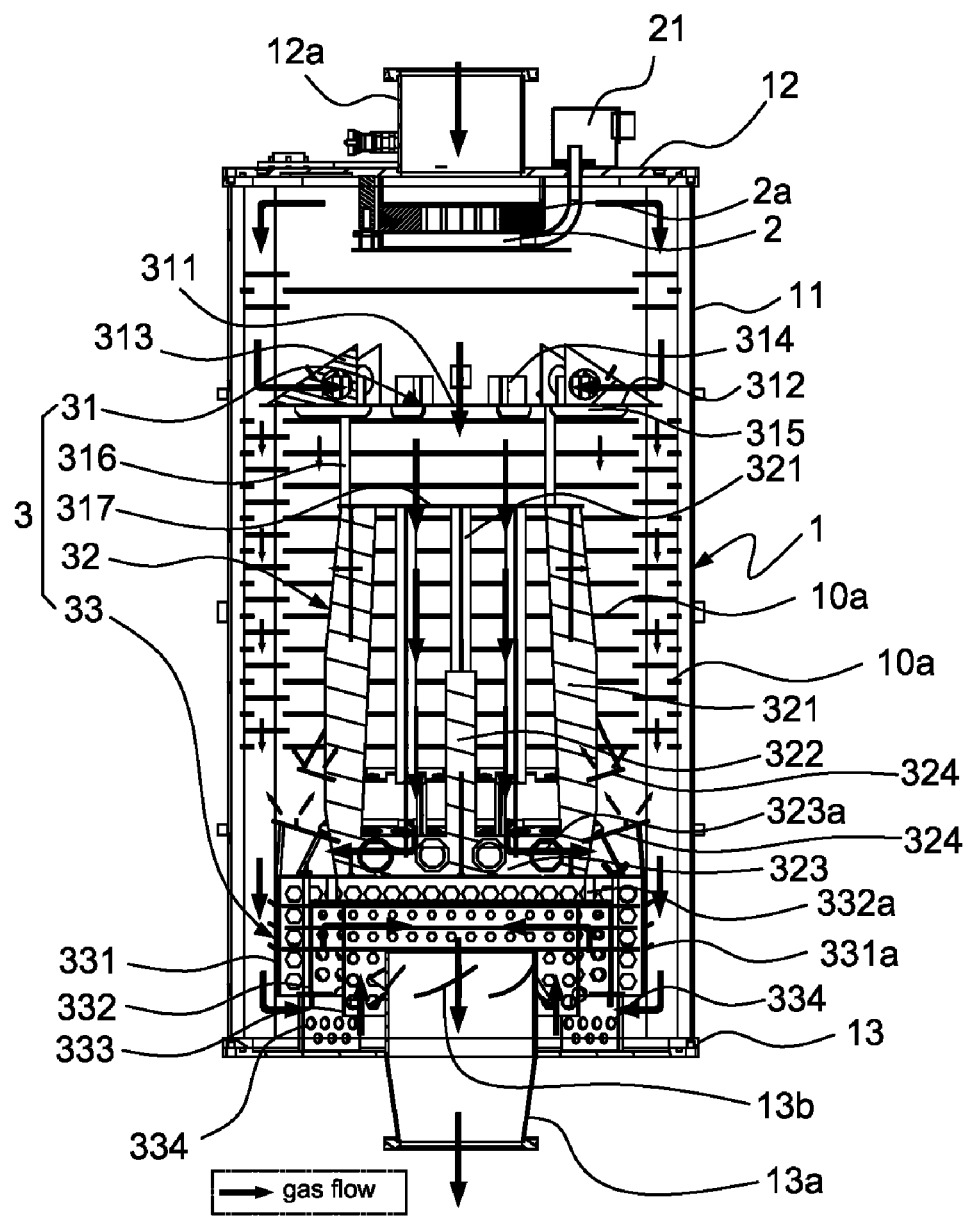
FIG. 10 is an exemplified view illustrating a gas flow in the apparatus for trapping of a reaction by-product according to the embodiment of the present disclosure during a former part of a use duration time.
Figure 11:
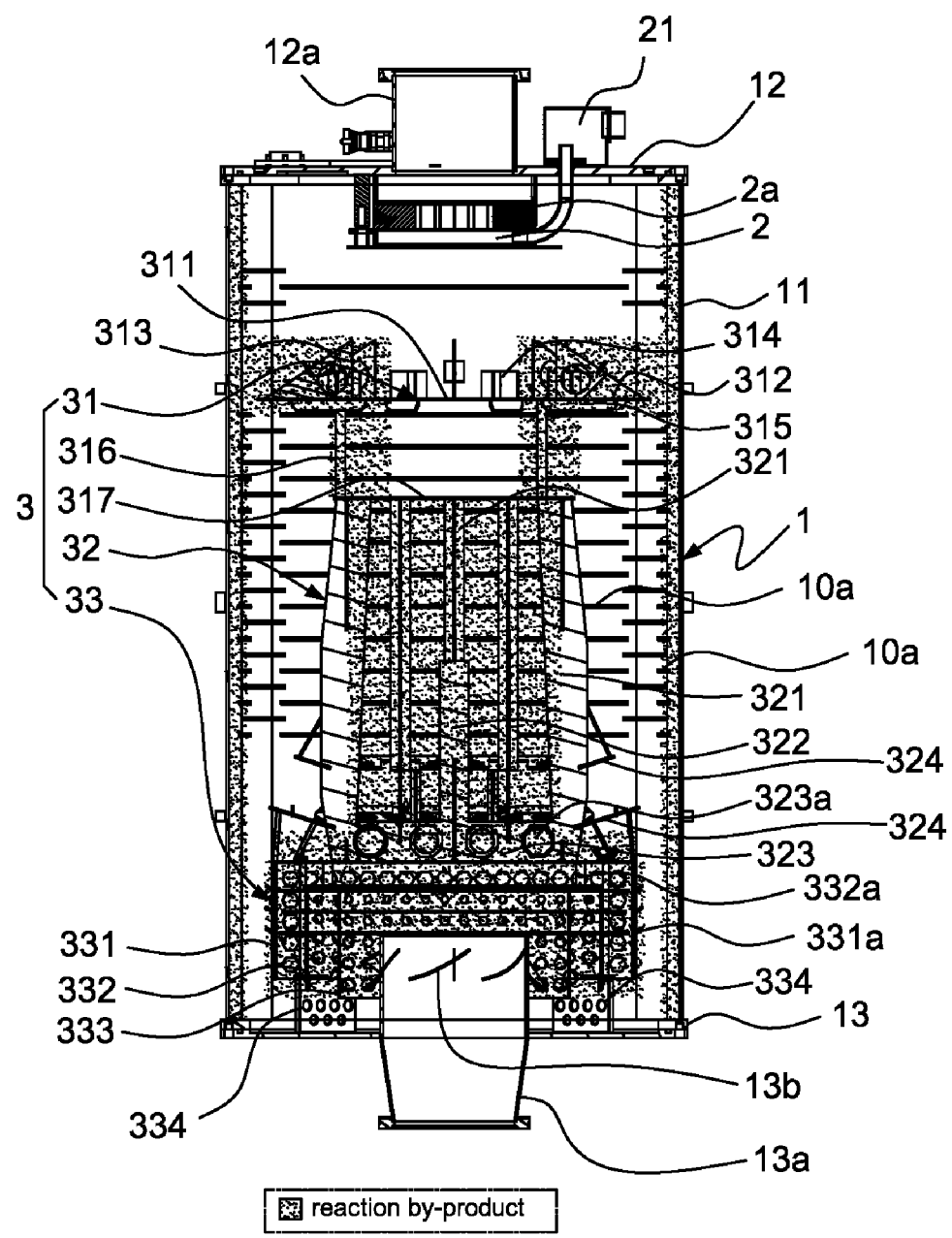
FIG. 11 is an exemplified view illustrating a trapping tendency in the apparatus for trapping of a reaction by-product according to the embodiment of the present disclosure during the former part of the use duration time.

FIG. 10 is an exemplified view illustrating a gas flow in the apparatus for trapping of a reaction by-product according to the embodiment of the present disclosure during the former part of a use duration time, and FIG. 11 is an exemplified view illustrating a trapping tendency in the apparatus for trapping of a reaction by-product according to the embodiment of the present disclosure during the former part of the use duration time. Hereinafter, reference numerals illustrated in the drawings are described in the above-mentioned description.

As illustrated, the gas flow and the reaction by-product trapping tendency during the former part of the use duration time will be described below.

The gas, which is introduced through the gas inlet port 12a provided on the upper plate 12 constituting the housing 1, is heated by the heater 2 and distributed radially to the outer periphery of the housing main body 11 by the heat radiating fins 2a positioned at the upper side, and then the gas flows downward.

Thereafter, the main flow of the gas is guided downward to the main gas hole 311 of the central portion from the outer periphery by the upper end trapping unit 31 of the internal trapping tower 3, and the trapping reaction is performed on the upper surface, the lower surface, and the triangular plates 313, the cross-shaped plates 314, and the quadrangular plates 315 installed on the upper surface.

The main flow of the gas flowing downward to the main gas hole 311 flows downward into the inner region in the intermediate trapping unit 32 and then is discharged to the outer region through the exhaust plate 323. In this case, the inner region of the planar cross-shaped vertical plates 321 and the inner cross-shaped vertical plate 322 coagulate the reaction by-product in the gas and trap the reaction by-product, such that the reaction by-product is accumulated in the inner region.

In particular, since the area in which the planar cross-shaped vertical plates 321 protruding toward the inner region is large at the upper side, the reaction by-product is accumulated in the internal space when the trapping reaction actively occurs at the upper side during the former part of the use duration time.

Thereafter, the gas discharged to the outer region through the exhaust plate 323 passes through the lower end trapping unit 33 having the multiple stages, and flows into the upper side of the gas discharge port 13a protruding upward from the central portion of the lower plate of the housing positioned inside the lower end trapping unit 33. Thereafter, the gas flows downward and is discharged.

Figure 12:
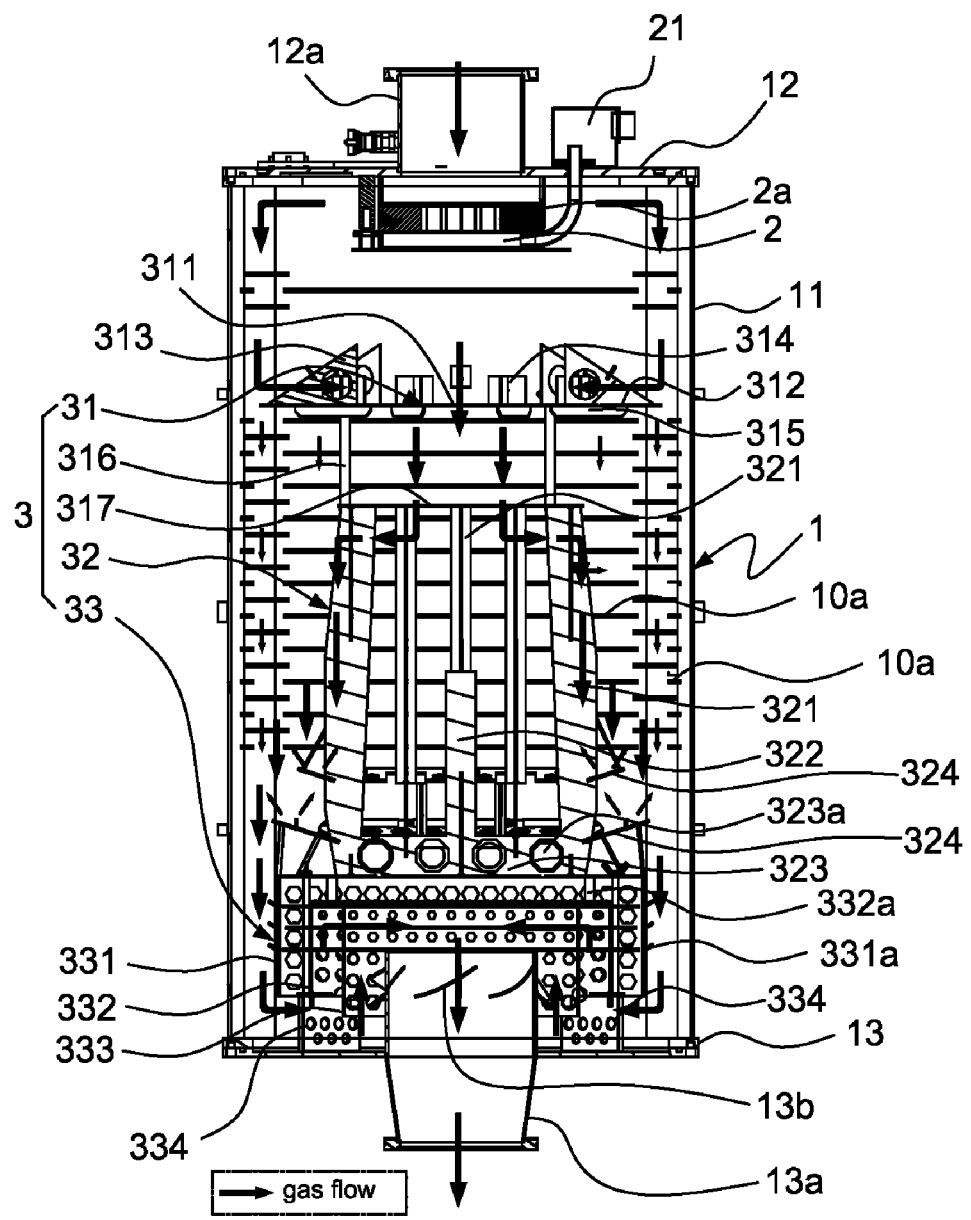
FIG. 12 is an exemplified view illustrating a gas flow in the apparatus for trapping of a reaction by-product according to the embodiment of the present disclosure during a latter part of the use duration time.
Figure 13:
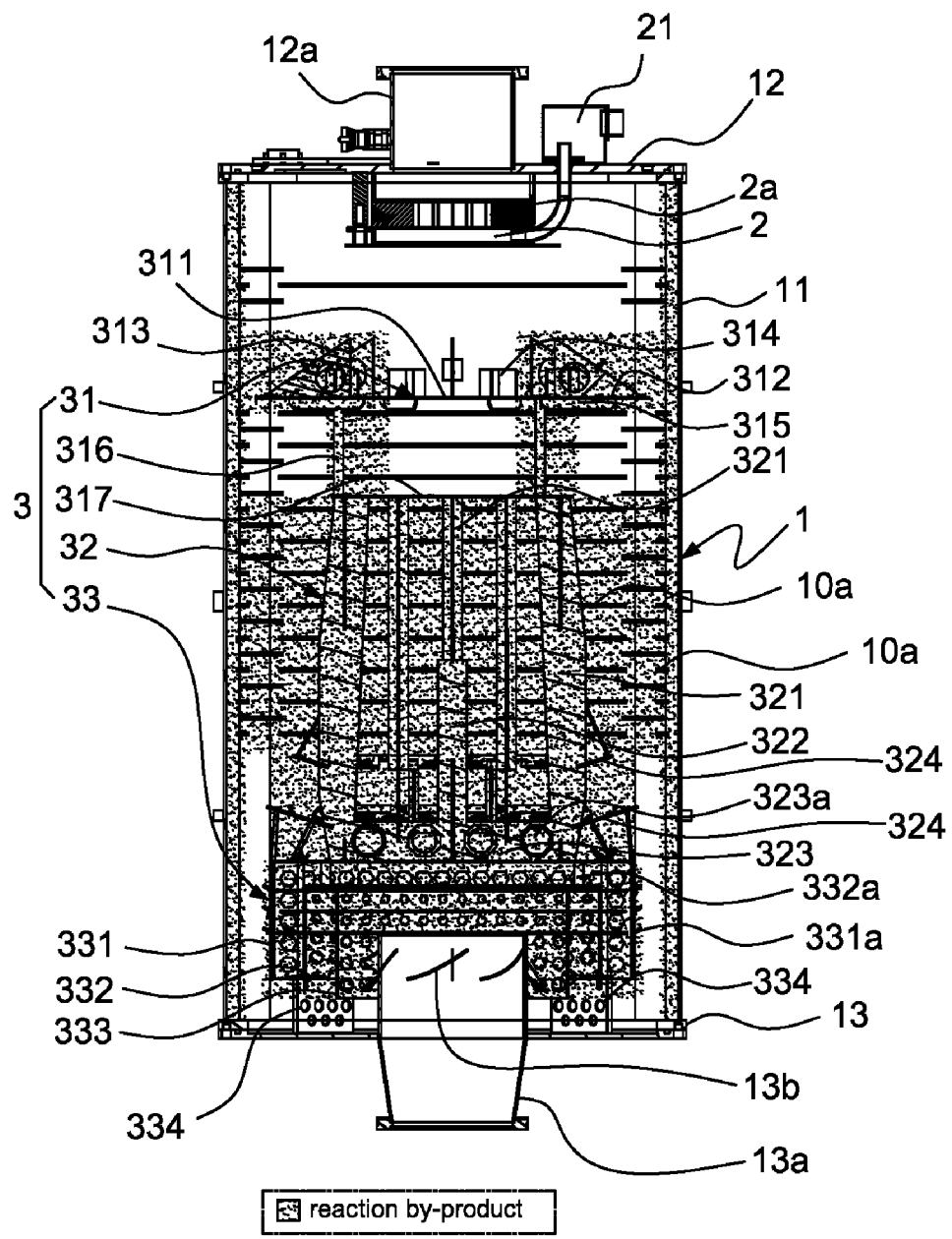
FIG. 13 is an exemplified view illustrating a trapping tendency in the apparatus for trapping of a reaction by-product according to the embodiment of the present disclosure during the latter part of the use duration time.

FIG. 12 is an exemplified view illustrating a gas flow in the apparatus for trapping of a reaction by-product according to the embodiment of the present disclosure during the latter part of the use duration time, and FIG. 13 is an exemplified view illustrating a trapping tendency in the apparatus for trapping of a reaction by-product according to the embodiment of the present disclosure during the latter part of the use duration time.

As illustrated, the gas flow and the reaction by-product trapping tendency during the latter part of the use duration time will be described below.

The gas, which is introduced through the gas inlet port 12a provided on the upper plate 12 constituting the housing 1, is heated by the heater 2 and distributed radially to the outer periphery of the housing main body 11 by the heat radiating fins 2a positioned at the upper side, and then the gas flows downward.

Thereafter, the main flow of the gas is guided downward to the main gas hole 311 of the central portion from the outer periphery by the upper end trapping unit 31 of the internal trapping tower 3, and the trapping reaction is performed on the upper surface, the lower surface, and the triangular plates 313, the cross-shaped plates 314, and the quadrangular plates 315 installed on the upper surface.

The main flow of the gas flowing downward to the main gas hole 311 cannot flow any further because the trapping space is reduced by the reaction by-product trapped and accumulated in the inner region of the planar cross-shaped vertical plates. Therefore, the gas flow is guided to the outer region from the upper side of the planar cross-shaped vertical plate, and the gas flows downward, such that the reaction by-product is additionally trapped in the outer region of the planar cross-shaped vertical plates in which the trapping reaction has not been actively performed.

In particular, since the area in which the planar cross-shaped vertical plates 321 protrude to the outer region is large at the lower side, the trapping reaction actively occurs at the lower side of the outer region during the latter part of the use duration time, and the trapping reaction actively occurs in the outer region defined by the housing main body and the outer side of the planar cross-shaped vertical plate 321, such that the reaction by-product is accumulated on the lower plate.

In this case, by the vortex plates 324 installed along the periphery of the lower side of the outer region of the plurality of planar cross-shaped vertical plates 321 defining the periphery, a flow velocity of the gas flowing downward is reduced, the vortex is generated, and the trapping reaction time is increased. Further, the vortex plates prevent the trapped and accumulated reaction by-product from being dropped and leaking to the gas discharge port.

Thereafter, the gas passes through the lower end trapping unit 33 and flows into the upper side of the gas discharge port 13a protruding upward from the central portion of the lower plate of the housing positioned inside the lower end trapping unit 33. Thereafter, the gas flows downward and is discharged.

The present disclosure is not limited to the specific exemplary embodiment described above, various modifications can be made by any person skilled in the art to which the present disclosure pertains without departing from the subject matter of the present disclosure as claimed in the claims, and the modifications are within the scope defined by the claims.

What is claimed is:

1. An apparatus for trapping of a reaction by-product contained in a gas which is discharged after a deposition process during a semiconductor manufacturing process, comprising:
    a housing (1) configured to accommodate the gas;
    a heater (2) configured to heat the gas;
    an internal trapping tower (3) configured to trap, in multiple stages, the reaction by-product according to height, the internal trapping tower (3) comprising:
        an upper end trapping unit (31) configured to perform a trapping reaction while guiding a main flow of the gas to a central portion;
        an intermediate trapping unit (32) having an inner region formed as a space portion so as to accommodate the gas introduced into the intermediate trapping unit and trap the reaction by-product; and
        a lower end trapping unit (33) configured to prevent a leak of the trapped reaction by-product to a gas discharge port (13a) of the housing while trapping, in multiple stages, the reaction by-product from the gas introduced through a lateral side, the upper end trapping unit (31), the intermediate trapping unit (32), and the lower end trapping unit (33) being separated provided, and
    wherein the upper end trapping unit (31) includes:
        a main gas hole (311) formed in a central portion of an upper surface of the upper end trapping unit (31),
        auxiliary gas holes (312) arranged around the main gas hole (311),
        triangular plates (313) radially arranged around the main gas hole (311) on the upper surface of the upper end trapping unit (31), wherein each triangular plate (313) traverses one or more of the auxiliary gas holes (312) and an inclination of said each triangular plate increases from the outer periphery toward the main gas hole, and
        cross-shaped plates (314) disposed between the triangular plates (313) and vertically protrude, wherein each cross-shaped plate traverses one or more the auxiliary gas holes (312), and
    wherein the intermediate trapping unit (32) includes a plurality of planar cross-shaped vertical plates (321) disposed to be spaced apart from one another to have gaps at predetermined intervals such that depending on a change in trapping amount according to an elapse of a use duration time, a main flow of the gas is guided so that the gas flows toward an outer region after flowing downward to an inner region of the planar cross-shaped vertical plates (321) defining a periphery during a former part of the use duration time, and the gas is guided to flow downward after flowing to the outer region of the planar cross-shaped vertical plates (321) from an upper side of the inner region during a latter part of the use duration time when the trapped reaction by-product is accumulated in the inner region, whereby an additional trapping reaction is performed.

2. The apparatus of claim 1, wherein the upper end trapping unit (31) guides the gas, which is distributed in a direction from the heater toward an outer periphery in the housing and flows downward, to the intermediate trapping unit (32) through the main gas hole (311) and the small auxiliary gas holes (312) circularly arranged around the main gas hole (311), the intermediate trapping unit (32) being disposed below the upper end trapping unit (31) and spaced apart from the upper end trapping unit (31) at a predetermined interval, and
    wherein the upper end trapping unit (31) traps the reaction by-product contained in the gas on an upper surface installed with the triangular plates (313) and the cross-shaped plates (314) and a lower surface installed with quadrangular plates (315).

3. The apparatus of claim 2,
    wherein the cross-shaped plates are radially arranged to guide the gas flow and generate vortices so as to improve trapping efficiency, and
    wherein the quadrangular plates are radially arranged on the lower surface of the upper end trapping unit (31) and vertically protrude while traversing the auxiliary gas holes (312) so as to perform the trapping while guiding the uniform downward flow of the gas moving downward through the main gas hole (311) and the auxiliary gas holes (312).

4. The apparatus of claim 1,
wherein a planar inner cross shaped vertical plate (322) is provided at a lower center of the inner region of the cross-shaped vertical plates (321) that defines the periphery.

5. The apparatus of claim 4, wherein an exhaust plate (323) is provided below the planar cross-shaped vertical plates (321) and the inner cross-shaped vertical plate (322) and has a plurality of gas holes (323a) through which the gas introduced into a lower side in the inner region is discharged to the outer region.

6. The apparatus of claim 4, wherein the planar cross-shaped vertical plate (321) is formed such that an area in which the planar cross-shaped vertical plate (321) protrudes toward the inner region is large at the upper side, and an area in which the planar cross-shaped vertical plate (321) protrudes toward the outer region is large at the lower side, such that a trapping space is formed such that a lower space in the inner region is larger than an upper space in the inner region.

7. The apparatus of claim 4, comprising:
vortex plates (324) disposed below the outer region of the planar cross shaped vertical plates (321) and having a plurality of gas holes (324a) installed along a periphery of the outer region of the planar cross-shaped vertical plates (321).

8. The apparatus of claim 7, wherein the vortex plates (324) are installed in multiple stages vertically, the vortex plate (324) at a lower stage is larger, and the vortex plate (324) is inclined so that an outer side thereof is high.

9. The apparatus of claim 1, wherein the lower end trapping unit (33) is connected to the lower portion of the intermediate trapping unit (32) and comprises an outer periphery trapping plate part (331), an intermediate trapping plate part (332), and an inner trapping plate part (333) which have a plurality of gas holes formed in surfaces thereof and are disposed in multiple stages,
wherein the lower end trapping unit (33) prevents the gas, which has experienced the trapping reaction in the inner region and the outer region of the intermediate trapping unit (32), from flowing downward directly into the gas discharge port (13a) provided on a lower plate of the housing,
wherein the gas is guided toward the inner side from the outer periphery, such that the trapping reaction is finally performed, and
wherein the flow of the gas is guided so that the gas flows into the upper side of the gas discharge port (13a) protruding upward from the central portion of the lower plate of the housing and then flows downward.

10. The apparatus of claim 9, where in the outer peripheral trapping plate part (331) has a structure opened at a lower side thereof and comprises an upper trapping plate and lateral trapping plates each having a plurality of gas holes, and
wherein a plurality of vortex generating pieces (331a) is installed along the outer surface of the outer periphery trapping plate part (331) and vertically arranged in multiple stages, and the plurality of vortex generating pieces (331a) is inclined upward at an inclination angle toward the outside.

11. The apparatus of claim 9, wherein the intermediate trapping plate part (332) has a structure opened at a lower side thereof and spaced apart from an upper surface of the outer peripheral trapping plate part (331) at a predetermined interval by spacers (332a), and the intermediate trapping plate part (332) comprises an upper trapping plate having a closed structure, and lateral trapping plates having a plurality of gas holes.

12. The apparatus of claim 9, wherein the inner trapping plate part (333) has a structure opened at upper and lower sides thereof and is fixed to the intermediate trapping plate part, and the inner trapping plate part (333) comprises lateral trapping plates having a plurality of gas holes.

13. The apparatus of claim 1, wherein the housing (1) comprises a plurality of filtering plates (13b) arranged at predetermined intervals, and the plurality of filtering plates (13b) protrudes in an oblique direction along a periphery of the gas discharge port (13a) protruding upward from a lower plate (13) and generates a vortex of the gas flowing upward.

* * * * *